United States Patent [19]

Fushikida

[11] Patent Number: 4,549,305
[45] Date of Patent: Oct. 22, 1985

[54] ADAPTIVE DIFFERENTIAL PCM DECODER

[75] Inventor: Katsunobu Fushikida, Tokyo, Japan

[73] Assignee: NEC Corporation, Tokyo, Japan

[21] Appl. No.: 493,647

[22] Filed: May 11, 1983

[30] Foreign Application Priority Data

May 14, 1982 [JP] Japan .................................. 57-80921

[51] Int. Cl.[4] ...................... H03K 13/22; H03K 13/01
[52] U.S. Cl. ........................................ 375/27; 375/32; 375/30; 332/11 D; 340/347 DA
[58] Field of Search ........................ 375/25, 27, 28, 30, 375/26, 34, 32; 333/14; 332/11 D, 11 R, 9 R; 340/347 DA

[56] References Cited

U.S. PATENT DOCUMENTS 3,609,551 9/1971 Brown .................................... 375/32
3,835,385 9/1974 Hoeschele et al. ..................... 375/30
3,925,731 12/1975 Brainard et al. ....................... 375/30
4,039,948 8/1977 Boxall .................................... 375/30
4,449,190 5/1984 Flanagan et al. ................... 375/122

Primary Examiner—Robert L. Griffin
Assistant Examiner—Raymond C. Glenny
Attorney, Agent, or Firm—Laff, Whitesel, Conte & Saret

[57] ABSTRACT

The present invention features an ADPCM decoder of the instantaneous companding type which comprises two memory circuits (each preferably PROM). The first memory contains a plurality of differential values and the second a plurality of step size control codes. The memories receives ADPCM input codes which function as address signals. The memories are connected through an adder and a shift register feedback connected with the adder. The first memory receives two inputs, one of which is an ADPCM input code and the other is an input consisting of the sum of the current output of the second memory plus the previous value outputted thereby. The first memory produces a differential value on the basis of the two inputs applied.

1 Claim, 1 Drawing Figure

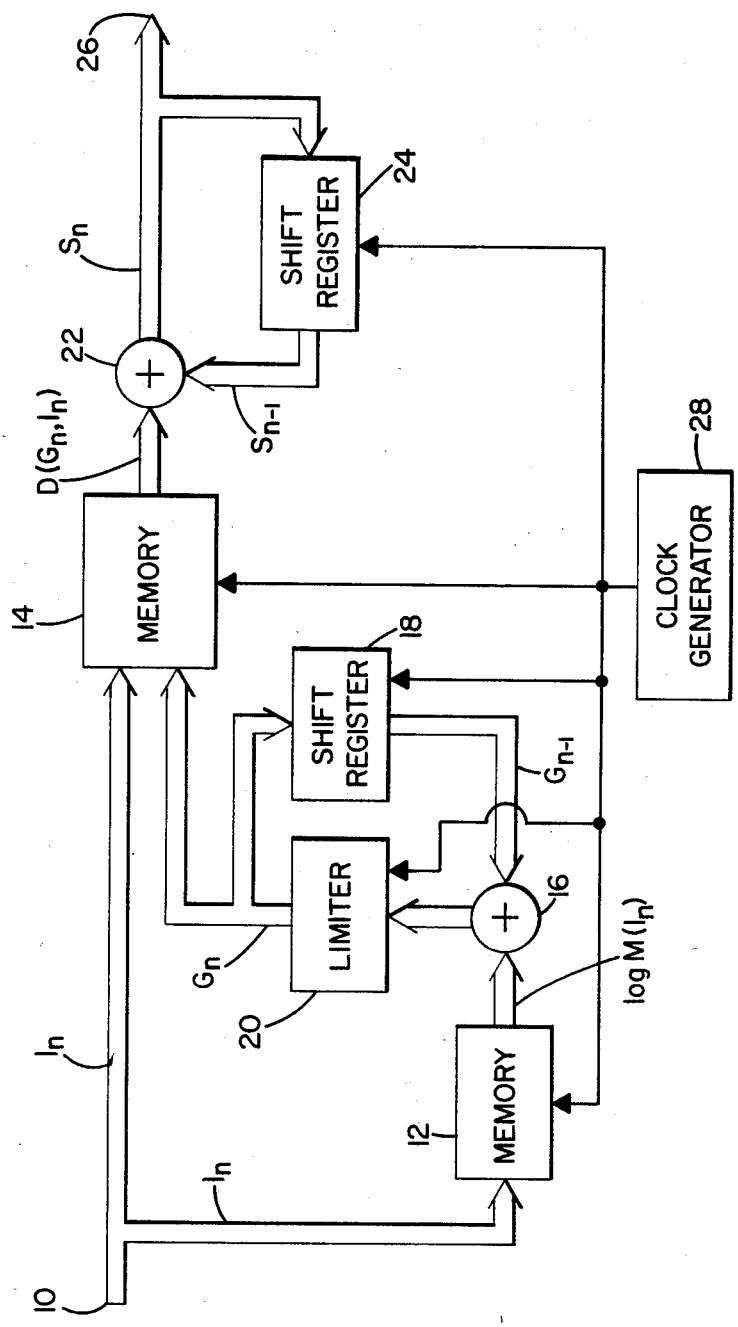

ADAPTIVE DIFFERENTIAL PCM DECODER

BACKGROUND OF THE INVENTION

1. Field of the Invention

This invention relates to an adaptive differential pulse code modulation (ADPCM) decoder and more specifically to such a decoder wherein each of differential values between two consecutive sampled waveforms is quantized by adaptively changing quantizer step sizes for each sampling period.

2. Description of the Prior Art

An ADPCM coding system is well known in the art, in which differential values of a sampled waveform of a speech signal (for example) are quantized by adaptively changing quantizer step sizes. Another ADPCM of an instantaneous companding type has been proposed which adapts, every sampling period, each quantizer step size.

The detailed explanation of the above is given in the documents entitled "Adaptive quantization with a one-word memory" and "Adaptive Quantization in Differential PCM Coding of Speech" (The Bell System Technical Journal, Vol. 52, No. 7, September, 1973).

A conventional ADPCM decoder of the instantaneous companding type is arranged based on the following equations:

$$g_n = g_{n-1} \times M(I_n) \tag{1}$$

$$S_n = g_n \times d_n + S_{n-1} \tag{2}$$

Where suffix "n" indicates n-th sampling time, and $g_n$: step size multiplier,
$I_n$: ADPCM code,
$M(I_n)$: control code for quantizer step size multiplier,
$S_n$: reproduced value, and
$d_n$: differential value between $S_n$ and $S_{n-1}$ and function of $I_n$.

As seen from the above equations, the previously known ADPCM decoders have required two multiplication processes per time-slot and thus have required complex and expensive circuitry.

SUMMARY OF THE INVENTION

It is an object of the present invention to provide an instantaneous companding type of ADPCM decoder which comprises two memory circuits for respectively pre-storing differential values and step size control codes.

It is another object of the invention to provide an ADPM decoder which is effective in processing audio signals, video signals, and other relatively wide range of signals.

In general terms the invention features an ADPCM decoder of the instantaneous companding type which comprises two memory circuits (each preferably a PROM). The first memory contains a plurality of differential values and the second a plurality of step size control codes. The memories receive ADPCM input codes which function as address signals. The memories are connected through an adder and a shift register feedback connected with the adder. The first memory receives two inputs, one of which is an ADPCM input code and the other is an input consisting of the sum of the current output of the second memory plus the previous value outputted by the adder. The first memory produces a differential value on the basis of the two inputs applied.

More specifically, the present invention takes the form of an adaptive differential PCM decoder for receiving adaptive differential PCM input codes and reproducing a replica of an original waveform, comprising: a first means for containing a plurality of differential values pre-stored therein, the first means receiving the input codes; a second means responsive to each of the input codes and adaptively generating a quantizer step size code which is applied to the first means, the first means selectively producing one differential value on the basis of the input code and the step size code applied thereto; and a waveform reproducing means for receiving the selected differential value from the first means and reproducing the replica.

BRIEF DESCRIPTION OF THE DRAWINGS

The features and advantages of the present invention will become more clearly appreciated from the following description taken in conjunction with the accompanying drawing in which:

the single drawing is a block diagram showing one example of an instantaneous companding type of ADPCM decoder according to the present invention.

DETAILED DESCRIPTION OF THE PREFERRED EMBODIMENT

The present invention takes advantage of a new parameter (step size multiplier) $G_n$ obtainable by taking logarithms of $g_n$ in equation (1):

$$G_n = \log(g_n) = \log(g_{n-1}) + \log M(I_n) \tag{3}$$

Since $\log(g_{n-1}) = G_{n-1}$, the equation (3) can be rewritten as follows:

$$G_n = G_{n-1} + \log M(I_n) \tag{3'}$$

This equation indicates that if $G_n$ is used instead of $g_n$, $G_n$ at the n-th sampling time can be obtained by summing $G_{n-1}$ and $\log M(I_n)$ both of which have been obtained at the (n−1)th sampling time. In other words, $G_n$ is obtainable only through an addition process by previously preparing the values of $\log M(I_n)$. Furthermore, in the present invention the differential value $g_n \times d_n$ in the equation (2) is replaced with a new differential value $D_n(G_n, I_n)$ dependent on $G_n$ and $I_n$. The desired differential value is selectable based on $G_n$ and $I_n$, whereby the replica $S_n$ is reproduced by adding $D_n(G_n, I_n)$ and $S_{n-1}$:

$$S_n = D_n(G_n, I_n) + S_{n-1} \tag{4}$$

Referring now to the accompanying drawing, $\log M(I_n)$ and $G_{n-1}$ in equation (3') are derived from a memory 12 and a shift register 18 respectively, and then added at an adder 16 to develop $G_n$ expressed by the equation (3'). In response to the code signals $G_n$ and $I_n$ which are used as address signals, an optimal differential value $D_n(G_n, I_n)$ is read out from a memory 14 in which optimal differential values $D_n(G_n, I_n)$ are previously stored for each combination of $G_n$ and $I_n$. The output $D_n$ of the memory 14 and the reproduced signal $S_{n-1}$ at (n−1)th sampling time are added at an adder 22 to reproduce the replica expressed by the equation (4).

In more detail, ADPCM input codes are applied, through an input terminal 10, to the two memory circuits 12 and 14 each of which is preferably a PROM (programmable read only memory). The ADPCM input codes each consists of 4 bits/sample (for example) and functions as an address signal to the memory circuits 12 and 14. The memory 12 has a plurality of quantizer step-size control codes (logM($I_n$)) pre-stored therein and selectively outputs one step size control code in response to each of the ADPCM input code words ($I_n$) applied thereto. The adder 16 is coupled both to the output of the memory circuit 12 and to the output of the shift register 18. The register 18 is adapted to store the quantizer step size code. The adder 16 is also coupled at its output to a limiter 20 which has its output coupled both to the memory circuit 14 and to the register 18. The limiter 20 prevents the value of $G_n$, which is used as an address signal to the memory 14, from deviating from a predetermined address code range. The content of the register 18 is renewed by each (viz., the most recent) output of the limiter 20, which occurs with each timing pulse. The memory circuit 14 has a memory capacity of, merely by way of example, 256 words each consisting of 8 bits, and thus may pre-store 256 different "differential values" ($D_n(G_n, I_n)$). The output of the memory circuit 14 is coupled to the adder 22. The adder 22 functions to add the differential value ($D_n(G_n, I_n)$) from the memory 14 and the output ($S_{n-1}$) of a delay register 24, and then output a reproduced signal ($S_n$) to an output terminal 26 and also to the register 24. The register 24 is renewed by each output of the adder 22. A clock generator 28 is coupled to and applies timing pulses to the elements 12, 14, 18, 20 and 24, as illustrated.

In the interest of easy understanding of the circuit operation, it is assumed that (a) each of the ADPCM codes applied to the input terminal 10 consists of 4 bits per sample, (b) the memory circuit 12 is provided with a 16-word memory capacity and pre-stores a plurality of control codes therein, (c) the memory 14 has a memory capacity of 256 words each formed of 8 bits, that is to say, can pre-store 256 different "differential values" each having 8-bit information.

In operation, the registers 18 and 24 are initially reset to zero (for example). The memory 12 generates the quantizer step size control codes (logM($I_n$)) in response to each of the ADPCM input codes ($I_n$) applied via the input terminal 10. As mentioned previously, the ADPCM input codes ($I_n$) each functions as an address signal to the memory 12 and also to the memory 14. The adder 16 receives the selected quantizer step size control code (logM($I_n$)) from the memory 12, and adds same to the step-size code ($G_{n-1}$) on the output of the register 18 and applies the resultant ($G_n$) to the limiter 20 according to the equation (3'). The limiter 20 is arranged to limit the values of the output thereof from a preselected lower limit to a preselected upper limit (for example 0–15). The output (4 bits) ($G_n$) of the limiter 20 is fed to the memory 14 as an address signal and also to the register 18 for renewing its content. The memory 14 responds to the two address codes, viz., the 4-bit ADPCM input code ($I_n$) from the terminal 10 and the 4-bit output ($G_n$) of the limiter 20, and selects one differential value ($D_n(G_n, I_n)$) from the 256 stored words. The differential value thus selected is applied to the adder 22, which adds selected value to the data ($S_{n-1}$) from the register 24 for producing the replica ($S_n$) of the original waveform at the output terminal 26 according to the equation (4). The output of the adder 22 is also fed to the register 24 which provides a delay to the reproduced code by one sampling period and applies the delayed code to the adder 22. The circuit arrangement of the adder 22 and the register 24 is well known in the art.

The foregoing description shows only preferred embodiments of the present invention. Various modifications are apparent to those skilled in the art without departing from the scope of the present invention which is only limited by the appended claims. For example, the present invention is not limited to waveforms of speech signals but is applicable to other waveforms of video signals, acoustic signals, for example.

What is claimed is:

1. An adaptive differential PCM decoder for receiving adaptive differential PCM input codes and for reproducing a replica of an original waveform, said decoder comprising:

a first multiword memory in which a plurality of differential values is stored, said first memory receiving said input codes and step size codes;

a second multiword memory in which a plurality of step size control codes is stored, said second memory receiving said input codes and outputting the step size control code selected on the basis of the received input code;

a circuit interconnecting said first and second memories, said circuit including an adder which adds a signal which is indicative of the current output of the second memory plus a previous output of the adder, said first memory outputting a differential value selected on the basis of said input codes and the output of said adder; and a waveform reproducing circuit for receiving the output of said first memory and for reproducing the replica.

* * * * *